(12) United States Patent
Wang et al.

(10) Patent No.: US 9,300,290 B1
(45) Date of Patent: Mar. 29, 2016

(54) CIRCUIT FOR LOW-POWER TERNARY DOMINO REVERSIBLE COUNTING UNIT

(71) Applicant: Ningbo University, Ningbo (CN)

(72) Inventors: Pengjun Wang, Ningbo (CN); Xuesong Zheng, Ningbo (CN); Yuejun Zhang, Ningbo (CN)

(73) Assignee: NINGBO UNIVERSITY, Ningbo (CN)

( * ) Notice: Subject to any disclaimer, the term of this patent is extended or adjusted under 35 U.S.C. 154(b) by 0 days.

(21) Appl. No.: 14/797,179

(22) Filed: Jul. 12, 2015

(30) Foreign Application Priority Data

Sep. 29, 2014 (CN) .......................... 2014 1 0513510

(51) Int. Cl.
*H03K 19/00* (2006.01)
*H03K 19/0944* (2006.01)

(52) U.S. Cl.
CPC ........ *H03K 19/0002* (2013.01); *H03K 19/0013* (2013.01)

(58) Field of Classification Search
CPC ................. H03K 19/0002; H03K 19/0013
USPC .............................................. 326/59, 119, 93
See application file for complete search history.

(56) References Cited

U.S. PATENT DOCUMENTS

| 3,663,804 | A | * | 5/1972 | Newell | ................... | H03K 29/00 377/115 |
| 5,517,145 | A | * | 5/1996 | Frank | ............... | H03K 3/356147 327/201 |
| 2014/0292373 | A1 | * | 10/2014 | Wang | ................. | H03K 19/0963 326/97 |

* cited by examiner

*Primary Examiner* — Daniel D Chang
(74) *Attorney, Agent, or Firm* — Matthias Scholl P.C.; Matthias Scholl

(57) ABSTRACT

A circuit for a ternary Domino reversible counting unit. The circuit includes a ternary adiabatic Domino D flip-flop, a ternary adiabatic Domino positive and negative circulation port, and a ternary adiabatic Domino T-operation circuit. The ternary adiabatic Domino T-operation circuit includes a first signal input end, a second signal input end, and a third signal input end, a selection signal input end, a signal output end, a first clock signal input end, and a second clock signal input end. The positive and negative circulation port includes a signal input end, a borrow terminal, a carry terminal, a first output end, a second output end, a first clock signal input end, a second clock signal input end, and a third clock signal input end. The D flip-flop includes a signal input end, a reset terminal, a set terminal, a reverse-phase set terminal, a signal output end.

4 Claims, 7 Drawing Sheets

CIRCUIT FOR LOW-POWER TERNARY DOMINO REVERSIBLE COUNTING UNIT

CROSS-REFERENCE TO RELATED APPLICATIONS

Pursuant to 35 U.S.C. §119 and the Paris Convention Treaty, this application claims the benefit of Chinese Patent Application No. 201410513510.9 filed Sep. 29, 2014, the contents of which are incorporated herein by reference. Inquiries from the public to applicants or assignees concerning this document or the related applications should be directed to: Matthias Scholl P.C., Attn.: Dr. Matthias Scholl Esq., 245 First Street, 18th Floor, Cambridge, Mass. 02142.

BACKGROUND OF THE INVENTION

1. Field of the Invention

The invention relates to a reversible counting unit, and more particularly to a circuit for a low-power ternary Domino reversible counting unit.

2. Description of the Related Art

The reversible counter is widely used in circuit design for pulse counting. A Domino circuit is superior to a static CMOS circuit in treatment area and speed. Typically, a Domino circuit is powered by a direct current power supply, and the energy is consumed without being recovered and thus, the overall power requirement is relatively high. Thus, it is urgent to develop a circuit that has a lower power requirement.

SUMMARY OF THE INVENTION

In view of the above-described problems, it is one objective of the invention to provide a circuit for a ternary Domino reversible counting unit that can recycle energy and has a low power requirement. For energy recycling, the node capacitor is precharged by electric charges in the precharging phase, and the electric charges are recycled to an AC pulse power supply in the evaluation phase.

To achieve the above objective, in accordance with one embodiment of the invention, there is provided a circuit for a low-power ternary Domino reversible counting unit, the circuit comprising a ternary adiabatic Domino D flip-flop, a ternary adiabatic Domino positive and negative circulation port, and a ternary adiabatic Domino T-operation circuit.

The ternary adiabatic Domino D flip-flop comprises a signal input end, a reset terminal, a set terminal, a reverse-phase set terminal, a signal output end, a first clock signal input end, a second clock signal input end, and a third clock signal input end; the first clock signal input end of the ternary adiabatic Domino D flip-flop receives a first clock signal, the second clock signal input end of the ternary adiabatic Domino D flip-flop receives a second clock signal, and the third clock signal input end of the ternary adiabatic Domino D flip-flop receives a third clock signal; amplitude levels of the first clock signal and the second clock signal correspond to Logic 2, and a phase difference of the first clock signal and the second clock signal is 180 degrees; an amplitude level of the third clock signal correspond to Logic 1, and a phase of the third clock signal is the same as that of the second clock signal.

The ternary adiabatic Domino positive and negative circulation port comprises a signal input end, a borrow terminal, a carry terminal, a first output end, a second output end, a first clock signal input end, a second clock signal input end, and a third clock signal input end; the first clock signal input end of the ternary adiabatic Domino positive and negative circulation port receives the first clock signal; the second clock signal input end of the ternary adiabatic Domino positive and negative circulation port receives the second clock signal; and the third clock signal input end of the ternary adiabatic Domino positive and negative circulation port receives the third clock signal.

The ternary adiabatic Domino T-operation circuit comprises a first signal input end, a second signal input end, and a third signal input end, a selection signal input end, a signal output end, a first clock signal input end, and a second clock signal input end; the first clock signal input end of the ternary adiabatic Domino T-operation circuit receives the first clock signal; the second clock signal input end of the ternary adiabatic Domino T-operation circuit receives the second clock signal.

The borrow terminal of the ternary adiabatic Domino positive and negative circulation port is a borrow terminal of the ternary Domino reversible counting unit; the carry terminal of the ternary adiabatic Domino positive and negative circulation port is a carry terminal of the ternary Domino reversible counting unit; the first output end of the ternary adiabatic Domino positive and negative circulation port is connected to the first signal input end of the ternary adiabatic Domino T-operation circuit; the second output end of the ternary adiabatic Domino positive and negative circulation port is connected to the third signal input end of the ternary adiabatic Domino T-operation circuit; the signal output end of the ternary adiabatic Domino T-operation is connected to the signal input end of the ternary adiabatic Domino D flip-flop; the signal input end of the ternary adiabatic Domino positive and negative circulation port is connected to the signal output end of the ternary adiabatic Domino D flip-flop, and a common connection end thereof is a signal output end of the ternary Domino reversible counting unit; the selection signal input end of the ternary adiabatic Domino T-operation circuit is a selection signal input end of the ternary Domino reversible counting unit; the reset terminal of the ternary adiabatic Domino D flip-flop is a reset terminal of the ternary Domino reversible counting unit; the set terminal of the ternary adiabatic Domino D flip-flop is a set terminal of the ternary Domino reversible counting unit; and the reverse-phase set terminal of the ternary adiabatic Domino D flip-flop is a reverse-phase set terminal of the ternary Domino reversible counting unit.

The ternary adiabatic Domino D flip-flop comprises a first ternary adiabatic Domino literal operation circuit, a Logic 1 and Logic 2 control signal generation circuit, and a response signal output circuit.

The first ternary adiabatic Domino literal operation circuit comprises a first PMOS, a second PMOS, a third PMOS, a fourth PMOS, a fifth PMOS, a sixth PMOS, a first NMOS, a second NMOS, a third NMOS, a fourth NMOS, a fifth NMOS, a sixth NMOS, a seventh NMOS, an eighth NMOS, a ninth NMOS, a tenth NMOS, an eleventh NMOS, a twelfth NMOS, and a thirteenth NMOS; each PMOS and each NMOS comprises a gate, a source, and a drain; the source of the first PMOS, the drain of the second NMOS, the gate of the second PMOS, the gate of the third NMOS, the source of the fourth PMOS, the drain of the fifth NMOS, the gate of the fifth PMOS, the gate of sixth NMOS, the source of the ninth NMOS, the source of the eleventh NMOS, and the source of the thirteenth NMOS are connected, and a common connecting terminal thereof serves as a first clock signal input end of the first ternary adiabatic Domino literal operation circuit; the gate of the first PMOS, the gate of the second NMOS, the source of the second PMOS, the drain of the third NMOS, the gate of the fourth PMOS, the gate of the fifth NMOS, the source of the fifth PMOS, the drain of the sixth NMOS, the gate of the eighth NMOS, the gate of the tenth NMOS and the gate of the twelfth NMOS are connected, and a common connecting terminal thereof serves as a second clock signal input end of the first ternary adiabatic Domino literal operation circuit; the gate of the first NMOS and the gate of the fourth NMOS are connected, and a common connecting terminal thereof serves as a signal input end of the first ternary adiabatic Domino literal operation circuit; the drain of the first PMOS, the source of the first NMOS, the gate of the third PMOS and the source of the tenth NMOS are connected; the drain of the first NMOS and the source of the second NMOS are connected; the drain of the second PMOS and the source of the third PMOS are connected, the drain of the third PMOS, the source of the third NMOS and the source of the seventh NMOS are connected; the drain of the fourth PMOS, the source of the fourth NOMS, the gate of the sixth PMOS and the gate of the seventh NMOS are connected; the drain of the fourth NOMS and the source of the fifth NMOS are connected; the drain of the fifth PMOS and the source of the sixth PMOS are connected; the drain of the sixth PMOS, the source of the sixth NMOS and the source of the eighth NMOS are connected; the drain of the eighth NOMS and the gate of the ninth NMOS are connected; the drain of the tenth NMOS and the gate of the eleventh NMOS are connected; the drain of the seventh NMOS and the source of the twelfth NMOS are connected; the drain of the twelfth NMOS and the gate of the thirteenth NMOS are connected; the drain of the ninth NMOS is a third signal output end of the first ternary adiabatic Domino literal operation circuit; the drain of the eleventh NMOS is a first signal output end of the first ternary adiabatic Domino literal operation circuit; the drain of the thirteenth NMOS is a second signal output end of the first ternary adiabatic Domino literal operation circuit.

The Logic 1 and Logic 2 control signal generation circuit comprises a seventh PMOS, an eighth PMOS, a fourteenth NMOS, a fifteenth NMOS, a sixteenth NMOS, a seventeenth NMOS, an eighteenth NMOS, a nineteenth NMOS, and a twentieth NMOS; the response signal output circuit comprises a ninth PMOS, a tenth PMOS, and a twenty-first NMOS; the source of the seventh PMOS, the source of the eighth PMOS, the drain of the twentieth NMOS, the gate of the twenty-first NMOS are connected to the first clock signal input end of the first ternary adiabatic Domino literal operation circuit and a connection terminal thereof serves as the first clock signal input end of the ternary adiabatic Domino D flip-flop; the gate of the seventh PMOS, the gate of the eighth PMOS, the gate of the twentieth NMOS, the source of the tenth PMOS, and the drain of the twenty-first NMOS are connected to the second clock signal input end of the first ternary adiabatic Domino literal operation circuit and a connection terminal thereof serves as the second clock signal input end of the ternary adiabatic Domino D flip-flop; the source of the ninth PMOS serves as the third clock signal input end of the ternary adiabatic Domino D flip-flop; the drain of the seventh PMOS, the source of the fourteenth NOMS and the gate of the ninth PMOS are connected; the drain of the eighth PMOS, the source of the fifteenth NMOS, the source of the sixteenth NMOS and the gate of the tenth PMOS are connected; the drain of the fourteenth NMOS, the drain of the fifteenth NMOS and the source of the seventeenth NMOS are connected; the drain of the seventeenth NMOS and the source of the eighteenth NMOS are connected; the drain of the eighteenth NMOS, the source of the twentieth NMOS and the drain of the nineteenth NMOS are connected; the source of the nineteenth NMOS and the drain of the sixteenth NMOS are connected; the gate of the fourteenth NMOS and the second signal output end of the first ternary adiabatic Domino T-operation circuit are connected; the gate of the fifteenth NMOS and the third signal output end of the first ternary adiabatic Domino T-operation circuit are connected; the gate of the sixteenth NMOS and the gate of the seventeenth NMOS are connected and a connection terminal thereof serves as the reset terminal of the ternary adiabatic Domino D flip-flop; the gate of the eighteenth NMOS is the reset terminal of the ternary adiabatic Domino D flip-flop; the gate of the nineteenth NMOS is the reverse-phase set terminal of the ternary adiabatic Domino D flip-flop; the drain of the ninth PMOS, the drain of the tenth PMOS and the source of the twenty-first NMOS are connected and a connection terminal thereof serves as the signal output end of the ternary adiabatic Domino D flip-flop.

The ternary adiabatic Domino positive and negative circulation port comprises a second ternary adiabatic Domino literal operation circuit, a third ternary adiabatic Domino literal operation circuit, a fourth ternary adiabatic Domino literal operation circuit, a Logic 1 and Logic 2 control signal generation circuit of a positive circulation port, a Logic 1 and Logic 2 control signal generation circuit of a negative circulation port, a first output circuit, and a second output circuit. Circuit structures of the second ternary adiabatic Domino literal operation circuit, the third ternary adiabatic Domino literal operation circuit, the fourth ternary adiabatic Domino literal operation circuit are the same as that of the first ternary adiabatic Domino literal operation circuit.

The Logic 1 and Logic 2 control signal generation circuit of the positive circulation port comprises an eleventh PMOS, a twelfth PMOS, a thirteenth PMOS, a fourteenth PMOS, a twenty-second NMOS, a twenty-third NMOS, a twenty-fourth NMOS, a twenty-fifth NMOS, a twenty-sixth NMOS, a twenty-seventh NMOS, a twenty-eighth NMOS, a twenty-ninth NMOS, a thirtieth NMOS, a thirty-first NMOS, a thirty-second NMOS, a thirty-third NMOS, a thirty-fourth NMOS and a thirty-fifth NMOS; the first output circuit comprises a fifteenth PMOS, a sixteenth PMOS and a thirty-sixth NMOS; the second output circuit comprises a seventeenth PMOS, an eighteenth PMOS and a thirty-seventh NMOS; the source of the eleventh PMOS, the source of the twelfth PMOS, the drain of the twenty-fourth NOMS, the source of the thirteenth PMOS, the source of the fourteenth PMOS, the drain of the thirty-first NMOS, the gate of the thirty-sixth NMOS, the gate of the thirty-seventh NMOS, the first clock signal input end of the second ternary adiabatic Domino literal operation circuit, the first clock signal input end of the third ternary adiabatic Domino literal operation circuit, and the first clock signal input end of the fourth ternary adiabatic Domino literal operation circuit are connected and a connection terminal thereof serves as the first clock signal input end of the ternary adiabatic Domino positive and negative circulation port; the gate of the eleventh PMOS, the gate of the twelfth PMOS, the gate of the twenty-fourth NMOS, the gate of the thirteenth PMOS, the gate of the fourteenth PMOS, the gate of the thirty-first NMOS, the source of the sixteenth PMOS, the drain of the thirty-sixth NMOS, the source of the eighteenth PMOS, the drain of the thirty-seventh NMOS, the second clock signal input end of the second ternary adiabatic Domino literal operation circuit, the second clock signal input end of the third ternary adiabatic Domino literal operation circuit, and the second clock signal input end of the fourth ternary adiabatic Domino literal operation circuit are connected and a connection terminal thereof serves as the second clock signal input end of the ternary adiabatic Domino positive and negative circulation port, the source of the fifteenth PMOS and the source of the seventeenth PMOS are connected and a connection terminal thereof serves as the third clock signal input end of the ternary adiabatic Domino positive and negative circulation port; the drain of the eleventh PMOS, the source of the twenty-second NMOS, the source of the twenty-sixth NMOS and the gate of the fifteenth PMOS are connected; the drain of the twelfth PMOS, the source of the twenty-seventh NMOS, the source of the twenty-eighth NMOS and the gate of the sixteenth PMOS are connected; the drain of the twenty-second NMOS, the source of the twenty-third NMOS and the drain of the twenty-seventh NMOS are connected; the drain of the twenty-sixth NMOS, the source of the twenty-fifth NMOS and the drain of the twenty-eighth NMOS are connected; the drain of the twenty-third NMOS, the drain of the twenty-fifth NMOS and the source of the twenty-fourth NMOS are connected; the drain of the thirteen PMOS, the source of the twenty-ninth NMOS, the source of the thirty-third NMOS and the gate of the seventeenth PMOS are connected; the drain of the fourteenth PMOS, the source of the thirty-fourth NMOS, the source of the thirty-fifth NMOS and the gate of the eighteenth PMOS are connected; the drain of the twenty-ninth NMOS, the source of the thirtieth NMOS and the drain of the thirty-fourth NMOS are connected; the drain of the thirty-third NMOS, the source of the thirty-second NMOS and the drain of the thirty-fifth NMOS are connected; the drain of the thirtieth NMOS, the drain of the thirty-second NMOS and the source of the thirty-first NMOS are connected; the drain of the fifteenth PMOS, the drain of the sixteenth PMOS and the source of the thirty-sixth NMOS are connected and a connection terminal thereof serves as the first signal output end of the ternary adiabatic Domino positive and negative circulation port; the drain of the seventeenth PMOS, the drain of the eighteenth PMOS and the source of the thirty-seventh NMOS are connected and a connection terminal thereof serves as the second signal output end of the ternary adiabatic Domino positive and negative circulation port; the gate of the twenty-second NMOS, the gate of thirty-fourth NMOS and the first signal output end of the second ternary adiabatic Domino literal operation circuit are connected; the gate of the twenty-sixth NMOS, the gate of the twenty-seventh NMOS, the gate of the thirty-third NMOS and the second signal output end of the second ternary adiabatic Domino literal operation circuit are connected; the gate of the twenty-eighth NMOS, the gate of the twenty-ninth NMOS, the gate of the thirty-fifth NMOS and the third signal output end of the second ternary adiabatic Domino literal operation circuit are connected; the gate of the twenty-fifth NMOS and the first signal output end of the third ternary adiabatic Domino literal operation circuit are connected; the gate of the twenty-third NMOS and the third signal output end of the third ternary adiabatic Domino literal operation circuit; the gate of the thirtieth NMOS and the first signal output end of the fourth ternary adiabatic Domino literal operation circuit are connected; the gate of the thirty-second NMOS and the third signal output end of the fourth ternary adiabatic Domino literal operation circuit are connected; the signal input end of the second ternary adiabatic Domino literal operation circuit serves as the signal input end of the ternary adiabatic Domino positive and negative circulation port; the signal input end of the fourth ternary adiabatic Domino literal operation circuit serves as the carry terminal of the ternary adiabatic Domino positive and negative circulation port, the signal input end of the fourth ternary adiabatic Domino literal operation circuit serves as the borrow terminal of the ternary adiabatic Domino positive and negative circulation port.

The ternary adiabatic Domino T-operation circuit comprises a Logic 0 gating circuit, a Logic 1 gating circuit, and a Logic 2 gating circuit; the Logic 0 gating circuit comprises a nineteenth PMOS, a twentieth PMOS, a twenty-first PMOS, a thirty-eighth NMOS, a thirty-ninth NMOS, a fortieth NMOS, a forty-first NMOS and a forty-second NMOS; the Logic 2 gating circuit comprises a twenty-second PMOS, a twenty-third PMOS, a forty-third NMOS, a forty-fourth NMOS and a forty-fifth NMOS; the Logic 1 gating circuit comprises a twenty-fourth PMOS, a twenty-fifth PMOS, a forty-sixth NMOS, a forty-seventh NMOS, a forty-eighth NMOS and a forty-ninth NMOS; the source of the nineteenth PMOS, the source of the twentieth PMOS, the drain of the thirty-ninth NMOS, the drain of the forty-first NMOS, the gate of the forty-second NMOS, the source of the twenty-second PMOS, the drain of the forty-fourth NMOS, the gate of the forty-fifth NMOS, the source of the twenty-fourth PMOS, the drain of the forty-eighth NMOS and the gate of the forty-ninth NMOS are connected and a connection terminal thereof serves as the first clock signal input end of the ternary adiabatic Domino T-operation circuit; the gate of the nineteenth PMOS, the gate of the twentieth PMOS, the gate of the thirty-ninth NMOS, the gate of the forty-first NMOS, the gate of the twenty-second PMOS, the gate of the forty-fourth NMOS, the gate of the twenty-fourth PMOS and the gate of the forty-eighth NMOS are connected and a connection terminal thereof serves as the second clock signal input end of the ternary adiabatic Domino T-operation circuit; the drain of the nineteenth PMOS, the source of the thirty-eighth NMOS and the gate of the fortieth NMOS are connected; the drain of the thirty-eighth NMOS and the source of the thirty-ninth NMOS are connected; the drain of the twentieth PMOS, the source of the fortieth NMOS, the gate of the twenty-first PMOS and the gate of the forty-sixth NMOD are connected; the drain of the fortieth NMOS and the source of the forty-first NMOS are connected; the source of the twenty-first PMOS and the drain of the forty-second NMOS are connected and a connection terminal thereof serves as the first signal input end of the ternary adiabatic Domino T-operation circuit; the gate of the thirty-eighth NMOS and the gate of the forty-third NMOS are connected and a connection terminal thereof serves as the selection signal input end of the ternary adiabatic Domino T-operation circuit; the drain of the twenty-second PMOS, the source of the forty-third NMOS, the gate of the twenty-third PMOS and the gate of the forty-seventh NMOS are connected; the drain of the forty-third NMOS and the source of the forty-fourth NMOS are connected; the source of the twenty-third PMOS and the drain of the forty-fifth NMOS are connected and a connection terminal thereof serves as the third signal input end of the ternary adiabatic Domino T-operation circuit; the drain of the twenty-fourth PMOS, the source of the forty-sixth NMOS and the gate of the twenty-fifth PMOS are connected; the drain of the forty-sixth NMOS and the source of the forty-seventh NMOS are connected; the drain of the forty-seventh NMOS and the source of the forty-eighth NMOS are connected; the source of the twenty-fifth PMOS and the drain of the forty-ninth NMOS are connected and a connection terminal thereof serves as the second signal input end of the ternary adiabatic Domino T-operation circuit; the drain of the twenty-first PMOS, the source of the forty-second NMOS, the drain of the twenty-third PMOS, the source of the forty-fifth NMOS, the drain of the twenty-fifth PMOS and the source of the forty-ninth NMOS are connected and a connection terminal thereof serves as the signal output end of the ternary adiabatic Domino T-operation circuit.

Advantages according to embodiments of the invention are summarized as follows. The circuit for a low-power ternary Domino reversible counting unit combines the technologies of multi-valued logic, adiabatic technique, and domino circuits, so that the structure is simple and practicable, and the resulting counter has accurate logic functions and low power.

BRIEF DESCRIPTION OF THE DRAWINGS

The invention is described herein below with reference to the accompanying drawings, in which.

DETAILED DESCRIPTION OF THE EMBODIMENTS

For further illustrating the invention, experiments detailing a circuit for a low-power ternary Domino reversible counting unit are described below. It should be noted that the following examples are intended to describe and not to limit the invention.

Figure 1:
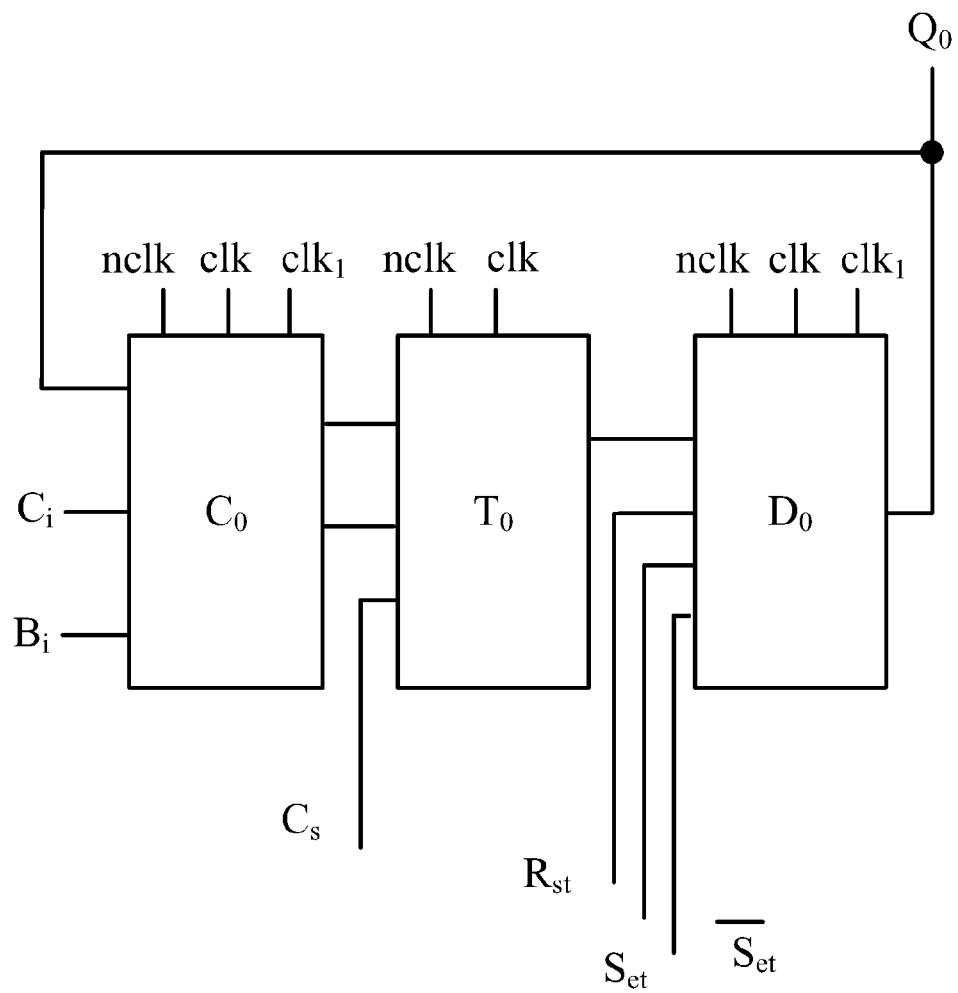
FIG. 1 is a schematic diagram of a circuit for a low-power ternary Domino reversible counting unit according to one embodiment of the invention.

As shown in FIG. 1, a circuit for a low-power ternary Domino reversible counting unit, the circuit comprises a ternary adiabatic Domino D flip-flop, a ternary adiabatic Domino positive and negative circulation port, and a ternary adiabatic Domino T-operation circuit.

Figure 11:
FIG. 11 shows oscillograms of a first clock signal, a second clock signal, and a third clock signal.

The ternary adiabatic Domino D flip-flop comprises a signal input end, a reset terminal, a set terminal, a reverse-phase set terminal, a signal output end, a first clock signal input end, a second clock signal input end, and a third clock signal input end; the first clock signal input end of the ternary adiabatic Domino D flip-flop receives a first clock signal, the second clock signal input end of the ternary adiabatic Domino D flip-flop receives a second clock signal, and the third clock signal input end of the ternary adiabatic Domino D flip-flop receives a third clock signal; amplitude levels of the first clock signal and the second clock signal correspond to Logic 2, and a phase difference of the first clock signal and the second clock signal is 180 degrees; an amplitude level of the third clock signal correspond to Logic 1, and a phase of the third clock signal is the same as that of the second clock signal; the oscillograms thereof are shown in FIG. 11. The ternary adiabatic Domino positive and negative circulation port comprises a signal input end, a borrow terminal, a carry terminal, a first output end, a second output end, a first clock signal input end, a second clock signal input end, and a third clock signal input end; the first clock signal input end of the ternary adiabatic Domino positive and negative circulation port receives the first clock signal; the second clock signal input end of the ternary adiabatic Domino positive and negative circulation port receives the second clock signal; and the third clock signal input end of the ternary adiabatic Domino positive and negative circulation port receives the third clock signal.

The ternary adiabatic Domino T-operation circuit comprises a first signal input end, a second signal input end, and a third signal input end, a selection signal input end, a signal output end, a first clock signal input end, and a second clock signal input end; the first clock signal input end of the ternary adiabatic Domino T-operation circuit receives the first clock signal; the second clock signal input end of the ternary adiabatic Domino T-operation circuit receives the second clock signal.

The borrow terminal of the ternary adiabatic Domino positive and negative circulation port is a borrow terminal of the ternary Domino reversible counting unit; the carry terminal of the ternary adiabatic Domino positive and negative circulation port is a carry terminal of the ternary Domino reversible counting unit; the first output end of the ternary adiabatic Domino positive and negative circulation port is connected to the first signal input end of the ternary adiabatic Domino T-operation circuit; the second output end of the ternary adiabatic Domino positive and negative circulation port is connected to the third signal input end of the ternary adiabatic Domino T-operation circuit; the signal output end of the ternary adiabatic Domino T-operation is connected to the signal input end of the ternary adiabatic Domino D flip-flop; the signal input end of the ternary adiabatic Domino positive and negative circulation port is connected to the signal output end of the ternary adiabatic Domino D flip-flop, and a common connection terminal thereof is a signal output end of the ternary Domino reversible counting unit; the selection signal input end of the ternary adiabatic Domino T-operation circuit is a selection signal input end of the ternary Domino reversible counting unit; the reset terminal of the ternary adiabatic Domino D flip-flop is a reset terminal of the ternary Domino reversible counting unit; the set terminal of the ternary adiabatic Domino D flip-flop is a set terminal of the ternary Domino reversible counting unit; and the reverse-phase set terminal of the ternary adiabatic Domino D flip-flop is a reverse-phase set terminal of the ternary Domino reversible counting unit.

In this example, the ternary adiabatic Domino D flip-flop comprises a first ternary adiabatic Domino literal operation circuit, a Logic 1 and Logic 2 control signal generation circuit, and a response signal output circuit.

Figure 2:
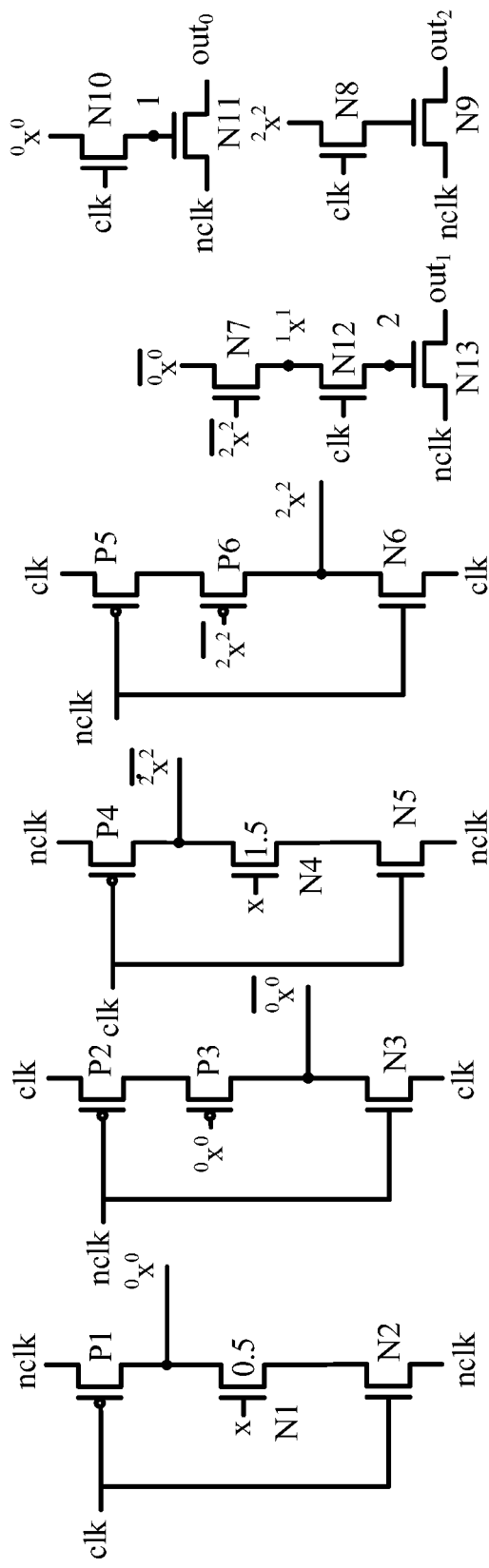
FIG. 2 is a circuit diagram of a first ternary adiabatic Domino literal operation circuit of a ternary adiabatic Domino D flip-flop according to one embodiment of the invention.

As shown in FIG. 2, the first ternary adiabatic Domino literal operation circuit comprises a first PMOS P1, a second PMOS P2, a third PMOS P3, a fourth PMOS P4, a fifth PMOS P5, a sixth PMOS P6, a first NMOS N1, a second NMOS N2, a third NMOS N3, a fourth NMOS N4, a fifth NMOS N5, a sixth NMOS N6, a seventh NMOS N7, an eighth NMOS N8, a ninth NMOS N9, a tenth NMOS N10, an eleventh NMOS N11, a twelfth NMOS N12, and a thirteenth NMOS N13; each PMOS and each NMOS comprises a gate, a source, and a drain; the source of the first PMOS P1, the drain of the second NMOS N2, the gate of the second PMOS P2, the gate of the third NMOS N3, the source of the fourth PMOS P4, the drain of the fifth NMOS N5, the gate of the fifth PMOS P5, the gate of sixth NMOS N6, the source of the ninth NMOS N9, the source of the eleventh NMOS N11, and the source of the thirteenth NMOS N13 are connected, and a common connecting terminal thereof serves as a first clock signal input end of the first ternary adiabatic Domino literal operation circuit; the gate of the first PMOS P1, the gate of the second NMOS N2, the source of the second PMOS P2, the drain of the third NMOS N3, the gate of the fourth PMOS P4, the gate of the fifth NMOS N5, the source of the fifth PMOS P5, the drain of the sixth NMOS N6, the gate of the eighth NMOS N8, the gate of the tenth NMOS N10 and the gate of the twelfth NMOS N12 are connected, and a common connecting terminal thereof serves as a second clock signal input end of the first ternary adiabatic Domino literal operation circuit; the gate of the first NMOS N1 and the gate of the fourth NMOS N4 are connected, and a common connecting terminal thereof serves as a signal input end of the first ternary adiabatic Domino literal operation circuit; the drain of the first PMOS P1, the source of the first NMOS N1, the gate of the third PMOS P3 and the source of the tenth NMOS N10 are connected; the drain of the first NMOS N1 and the source of the second NMOS N2 are connected; the drain of the second PMOS P2 and the source of the third PMOS P3 are connected; the drain of the third PMOS P3, the source of the third NMOS N3 and the source of the seventh NMOS N7 are connected; the drain of the fourth PMOS P4, the source of the fourth NOMS N4, the gate of the sixth PMOS P6 and the gate of the seventh NMOS N7 are connected; the drain of the fourth NOMS N4 and the source of the fifth NMOS N5 are connected; the drain of the fifth PMOS P5 and the source of the sixth PMOS P6 are connected; the drain of the sixth PMOS P6, the source of the sixth NMOS N6 and the source of the eighth NMOS N8 are connected; the drain of the eighth NOMS N8 and the gate of the ninth NMOS N9 are connected; the drain of the tenth NMOS N10 and the gate of the eleventh NMOS N11 are connected; the drain of the seventh NMOS N7 and the source of the twelfth NMOS N12 are connected; the drain of the twelfth NMOS N12 and the gate of the thirteenth NMOS N13 are connected; the drain of the ninth NMOS N9 is a third signal output end of the first ternary adiabatic Domino literal operation circuit; the drain of the eleventh NMOS N11 is a first signal output end of the first ternary adiabatic Domino literal operation circuit; the drain of the thirteenth NMOS N13 is a second signal output end of the first ternary adiabatic Domino literal operation circuit.

Figure 3:
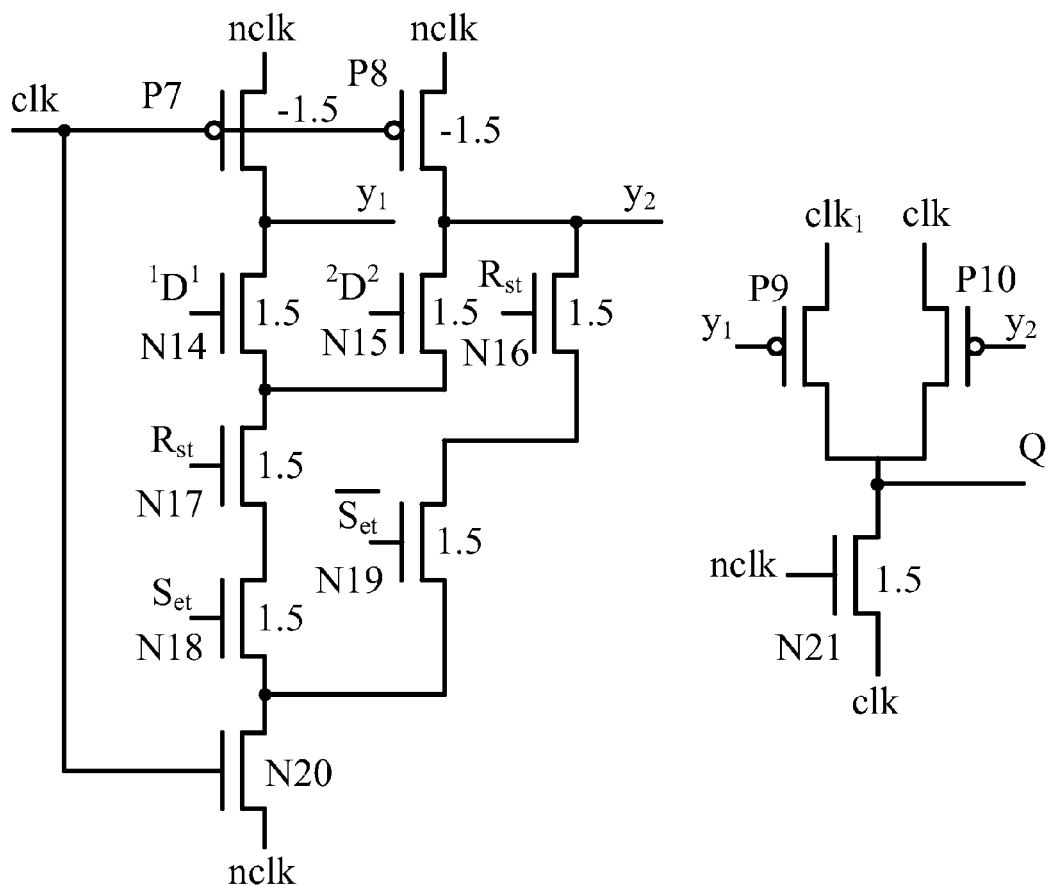
FIG. 3 is a circuit diagram of a Logic 1 and Logic 2 control signal generation circuit of a ternary adiabatic Domino D flip-flop according to one embodiment of the invention.
Figure 4:
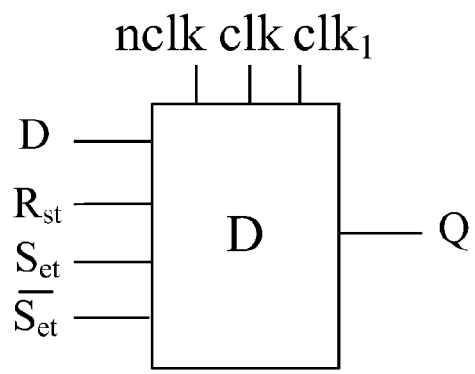
FIG. 4 is a graphical diagram of a ternary adiabatic Domino D flip-flop according to one embodiment of the invention.

As shown in FIG. 3, the Logic 1 and Logic 2 control signal generation circuit comprises a seventh PMOS P7, an eighth PMOS P8, a fourteenth NMOS N14, a fifteenth NMOS N15, a sixteenth NMOS N16, a seventeenth NMOS N17, an eighteenth NMOS N18, a nineteenth NMOS N19, and a twentieth NMOS N20; the response signal output circuit comprises a ninth PMOS P9, a tenth PMOS P10, and a twenty-first NMOS N21; the source of the seventh PMOS P7, the source of the eighth PMOS P8, the drain of the twentieth NMOS N20, the gate of the twenty-first NMOS N21 are connected to the first clock signal input end of the first ternary adiabatic Domino literal operation circuit and a connection terminal thereof serves as the first clock signal input end of the ternary adiabatic Domino D flip-flop; the gate of the seventh PMOS P7, the gate of the eighth PMOS P8, the gate of the twentieth NMOS N20, the source of the tenth PMOS P10, and the drain of the twenty-first NMOS N21 are connected to the second clock signal input end of the first ternary adiabatic Domino literal operation circuit and a connection terminal thereof serves as the second clock signal input end of the ternary adiabatic Domino D flip-flop; the source of the ninth PMOS P9 serves as the third clock signal input end of the ternary adiabatic Domino D flip-flop; the drain of the seventh PMOS P7, the source of the fourteenth NOMS N14 and the gate of the ninth PMOS P9 are connected; the drain of the eighth PMOS P8, the source of the fifteenth NMOS N15, the source of the sixteenth NMOS N16 and the gate of the tenth PMOS P10 are connected; the drain of the fourteenth NMOS N14, the drain of the fifteenth NMOS N15 and the source of the seventeenth NMOS N17 are connected; the drain of the seventeenth NMOS N17 and the source of the eighteenth NMOS N18 are connected; the drain of the eighteenth NMOS N18, the source of the twentieth NMOS N20 and the drain of the nineteenth NMOS N19 are connected; the source of the nineteenth NMOS N19 and the drain of the sixteenth NMOS N16 are connected; the gate of the fourteenth NMOS N14 and the second signal output end of the first ternary adiabatic Domino T-operation circuit are connected; the gate of the fifteenth NMOS N15 and the third signal output end of the first ternary adiabatic Domino T-operation circuit are connected; the gate of the sixteenth NMOS N16 and the gate of the seventeenth NMOS N17 are connected and a connection terminal thereof serves as the reset terminal of the ternary adiabatic Domino D flip-flop; the gate of the eighteenth NMOS N18 is the reset terminal of the ternary adiabatic Domino D flip-flop; the gate of the nineteenth NMOS N19 is the reverse-phase set terminal of the ternary adiabatic Domino D flip-flop; the drain of the ninth PMOS P9, the drain of the tenth PMOS P10 and the source of the twenty-first NMOS N21 are connected and a connection terminal thereof serves as the signal output end of the ternary adiabatic Domino D flip-flop. FIG. 4 is a graphical diagram of the ternary adiabatic Domino D flip-flop.

The ternary adiabatic Domino positive and negative circulation port comprises a second ternary adiabatic Domino literal operation circuit, a third ternary adiabatic Domino literal operation circuit, a fourth ternary adiabatic Domino literal operation circuit, a Logic 1 and Logic 2 control signal generation circuit of a positive circulation port, a Logic 1 and Logic 2 control signal generation circuit of a negative circulation port, a first output circuit, and a second output circuit. Circuit structures of the second ternary adiabatic Domino literal operation circuit, the third ternary adiabatic Domino literal operation circuit, the fourth ternary adiabatic Domino literal operation circuit are the same as that of the first ternary adiabatic Domino literal operation circuit.

Figure 5:
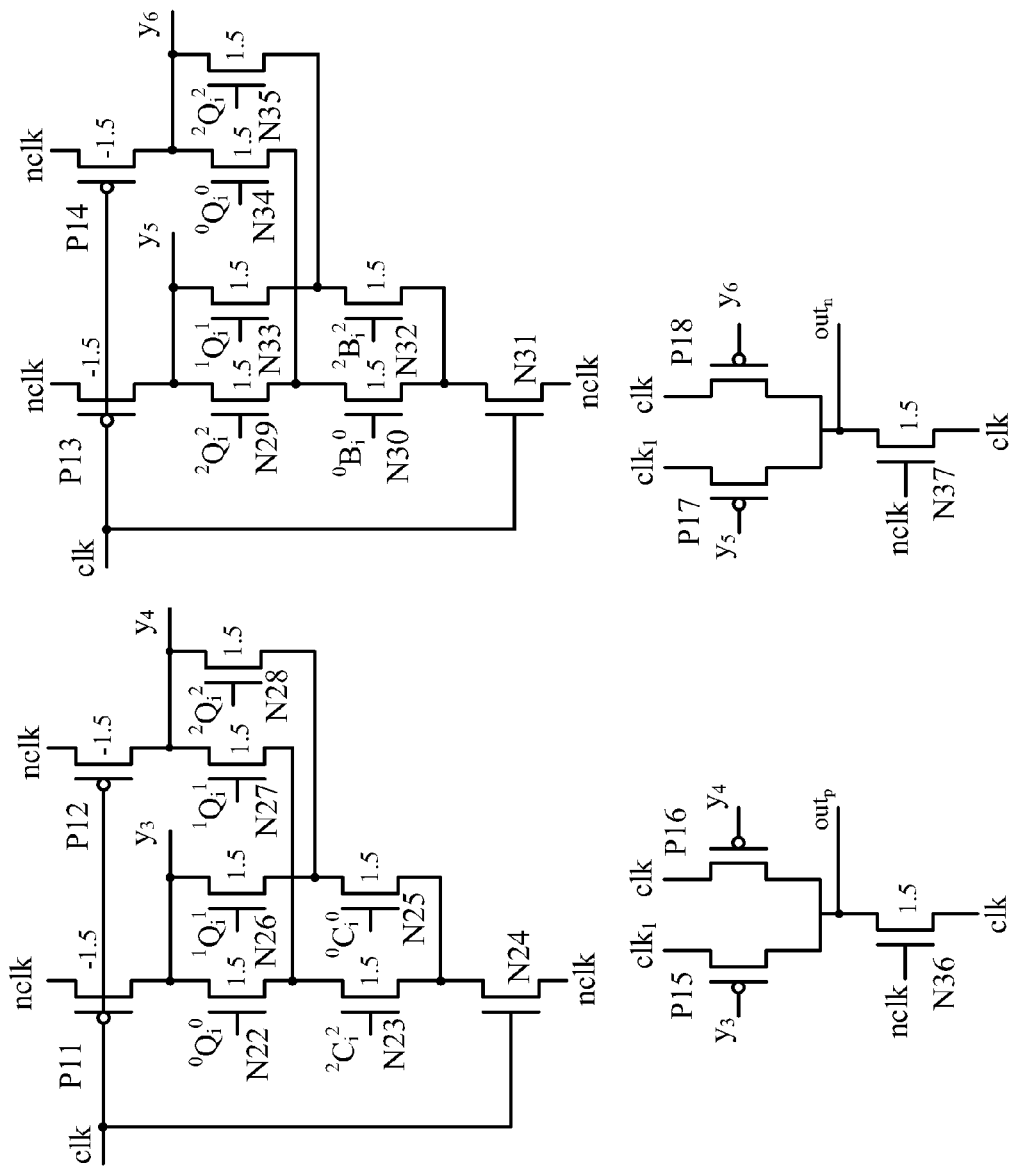
FIG. 5 is a circuit diagram of a ternary adiabatic Domino positive and negative circulation port according to one embodiment of the invention.

As shown in FIG. 5, the Logic 1 and Logic 2 control signal generation circuit of the positive circulation port comprises an eleventh PMOS P11, a twelfth PMOS P12, a thirteenth PMOS P13, a fourteenth PMOS P14, a twenty-second NMOS N22, a twenty-third NMOS N23, a twenty-fourth NMOS N24, a twenty-fifth NMOS N25, a twenty-sixth NMOS N26, a twenty-seventh NMOS N27, a twenty-eighth NMOS N28, a twenty-ninth NMOS N29, a thirtieth NMOS N30, a thirty-first NMOS N31, a thirty-second NMOS N32, a thirty-third NMOS N33, a thirty-fourth NMOS N34 and a thirty-fifth NMOS N35; the first output circuit comprises a fifteenth PMOS P15, a sixteenth PMOS P16 and a thirty-six NMOS N36; the second output circuit comprises a seventeenth PMOS P17, an eighteenth PMOS P18 and a thirty-seventh NMOS N37; the source of the eleventh PMOS P11, the source of the twelfth PMOS P12, the drain of the twenty-fourth NOMS N24, the source of the thirteenth PMOS P13, the source of the fourteenth PMOS P14, the drain of the thirty-first NMOS N31, the gate of the thirty-sixth NMOS N36, the gate of the thirty-seventh NMOS N37, the first clock signal input end of the second ternary adiabatic Domino literal operation circuit, the first clock signal input end of the third ternary adiabatic Domino literal operation circuit, and the first clock signal input end of the fourth ternary adiabatic Domino literal operation circuit are connected and a connection terminal thereof serves as the first clock signal input end of the ternary adiabatic Domino positive and negative circulation port; the gate of the eleventh PMOS P11, the gate of the twelfth PMOS P12, the gate of the twenty-fourth NMOS N24, the gate of the thirteenth PMOS P13, the gate of the fourteenth PMOS P14, the gate of the thirty-first NMOS N31, the source of the sixteenth PMOS P16, the drain of the thirty-sixth NMOS N36, the source of the eighteenth PMOS P18, the drain of the thirty-seventh NMOS N37, the second clock signal input end of the second ternary adiabatic Domino literal operation circuit, the second clock signal input end of the third ternary adiabatic Domino literal operation circuit, and the second clock signal input end of the fourth ternary adiabatic Domino literal operation circuit are connected and a connection terminal thereof serves as the second clock signal input end of the ternary adiabatic Domino positive and negative circulation port; the source of the fifteenth PMOS P15 and the source of the seventeenth PMOS P17 are connected and a connection terminal thereof serves as the third clock signal input end of the ternary adiabatic Domino positive and negative circulation port; the drain of the eleventh PMOS P11, the source of the twenty-second NMOS N22, the source of the twenty-sixth NMOS N26 and the gate of the fifteenth PMOS P15 are connected; the drain of the twelfth PMOS P12, the source of the twenty-seventh NMOS N27, the source of the twenty-eighth NMOS N28 and the gate of the sixteenth PMOS P16 are connected; the drain of the twenty-second NMOS N22, the source of the twenty-third NMOS N23 and the drain of the twenty-seventh NMOS N27 are connected; the drain of the twenty-sixth NMOS N26, the source of the twenty-fifth NMOS N25 and the drain of the twenty-eighth NMOS N28 are connected; the drain of the twenty-third NMOS N23, the drain of the twenty-fifth NMOS N25 and the source of the twenty-fourth NMOS N24 are connected; the drain of the thirteen PMOS P13, the source of the twenty-ninth NMOS N29, the source of the thirty-third NMOS N33 and the gate of the seventeenth PMOS P17 are connected; the drain of the fourteenth PMOS P14, the source of the thirty-fourth NMOS N34, the source of the thirty-fifth NMOS N35 and the gate of the eighteenth PMOS P18 are connected; the drain of the twenty-ninth NMOS N29, the source of the thirtieth NMOS N30 and the drain of the thirty-fourth NMOS N34 are connected; the drain of the thirty-third NMOS N33, the source of the thirty-second NMOS N32 and the drain of the thirty-fifth NMOS N35 are connected; the drain of the thirtieth NMOS N30, the drain of the thirty-second NMOS N32 and the source of the thirty-first NMOS N31 are connected; the drain of the fifteenth PMOS P15, the drain of the sixteenth PMOS P16 and the source of the thirty-sixth NMOS N36 are connected and a connection terminal thereof serves as the first signal output end of the ternary adiabatic Domino positive and negative circulation port; the drain of the seventeenth PMOS P17, the drain of the eighteenth PMOS P18 and the source of the thirty-seventh NMOS N37 are connected and a connection terminal thereof serves as the second signal output end of the ternary adiabatic Domino positive and negative circulation port; the gate of the twenty-second NMOS N22, the gate of thirty-fourth NMOS N34 and the first signal output end of the second ternary adiabatic Domino literal operation circuit are connected; the gate of the twenty-sixth NMOS N26, the gate of the twenty-seventh NMOS N27, the gate of the thirty-third NMOS N33 and the second signal output end of the second ternary adiabatic Domino literal operation circuit are connected; the gate of the twenty-eighth NMOS N28, the gate of the twenty-ninth NMOS N29, the gate of the thirty-fifth NMOS N35 and the third signal output end of the second ternary adiabatic Domino literal operation circuit are connected; the gate of the twenty-fifth NMOS N25 and the first signal output end of the third ternary adiabatic Domino literal operation circuit are connected; the gate of the twenty-third NMOS N23 and the third signal output end of the third ternary adiabatic Domino literal operation circuit; the gate of the thirtieth NMOS N30 and the first signal output end of the fourth ternary adiabatic Domino literal operation circuit are connected; the gate of the thirty-second NMOS N32 and the third signal output end of the fourth ternary adiabatic Domino literal operation circuit are connected; the signal input end of the second ternary adiabatic Domino literal operation circuit serves as the signal input end of the ternary adiabatic Domino positive and negative circulation port; the signal input end of the fourth ternary adiabatic Domino literal operation circuit serves as the carry terminal of the ternary adiabatic Domino positive and negative circulation port, the signal input end of the fourth ternary adiabatic Domino literal operation circuit serves as the borrow terminal of the ternary adiabatic Domino positive and negative circulation port.

Figure 6:
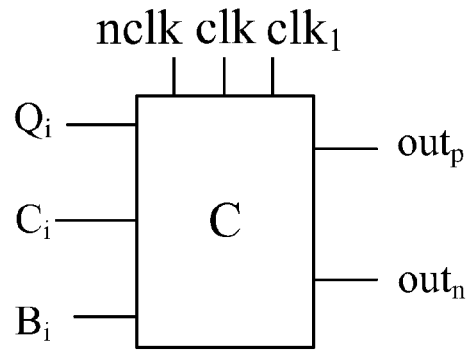
FIG. 6 is a graphical diagram of a ternary adiabatic Domino positive and negative circulation port according to one embodiment of the invention.
Figure 7:
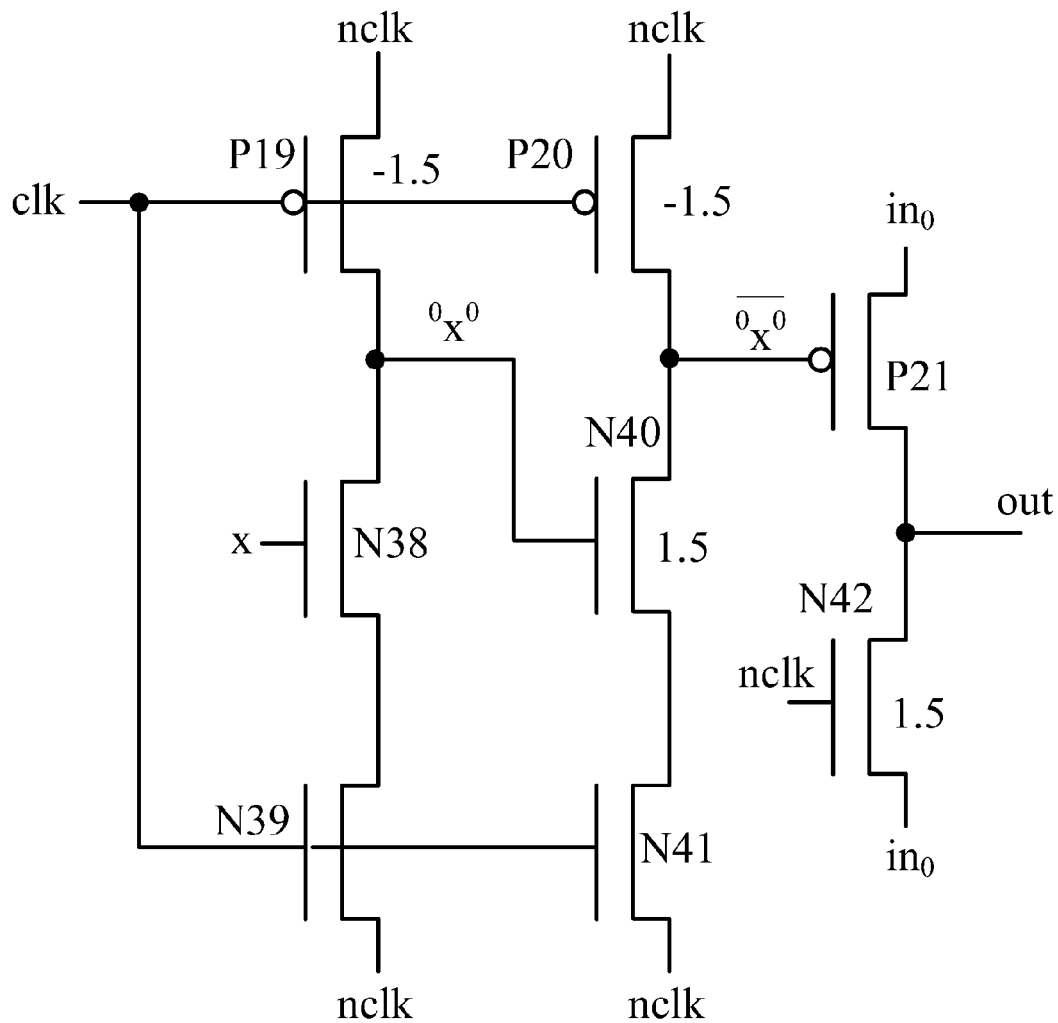
FIG. 7 is a circuit diagram of a Logic 0 gating circuit of a ternary adiabatic Domino T-operation circuit according to one embodiment of the invention.
Figure 8:
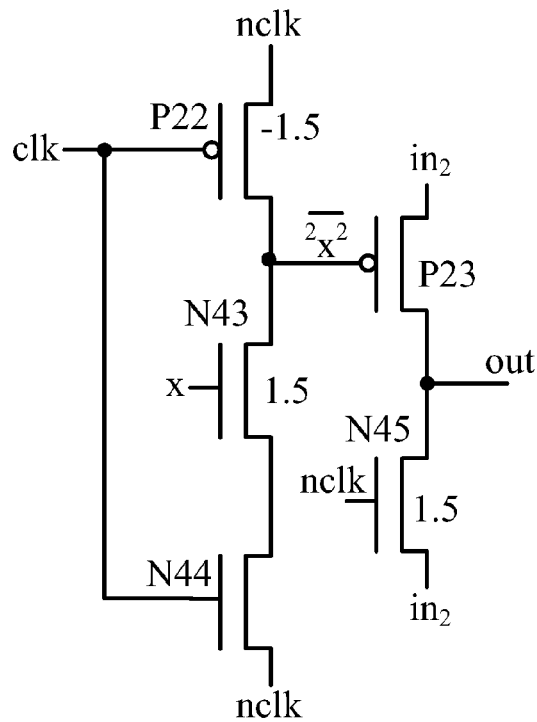
FIG. 8 is a circuit diagram of a Logic 2 gating circuit of a ternary adiabatic Domino T-operation circuit according to one embodiment of the invention.
Figure 9:
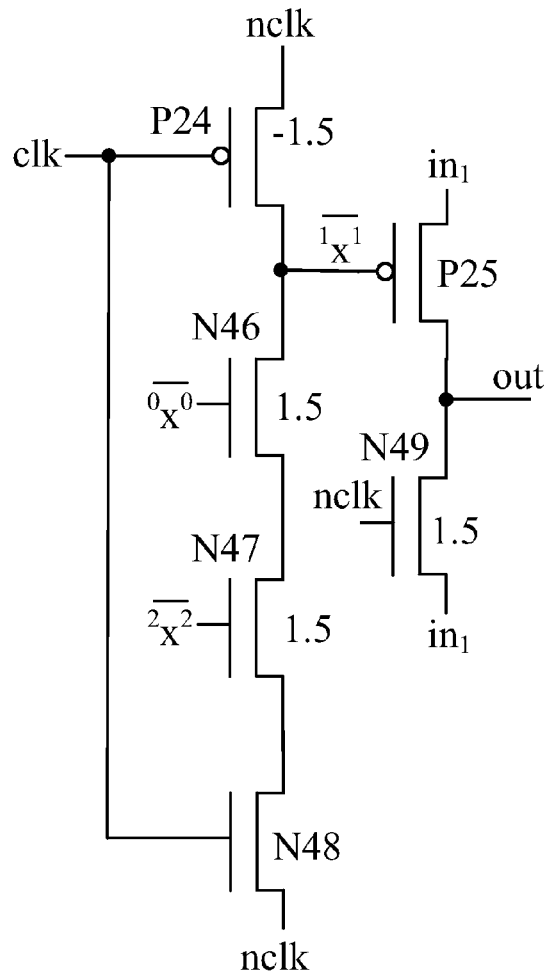
FIG. 9 is a circuit diagram of a Logic 1 gating circuit of a ternary adiabatic Domino T-operation circuit according to one embodiment of the invention.
Figure 10:
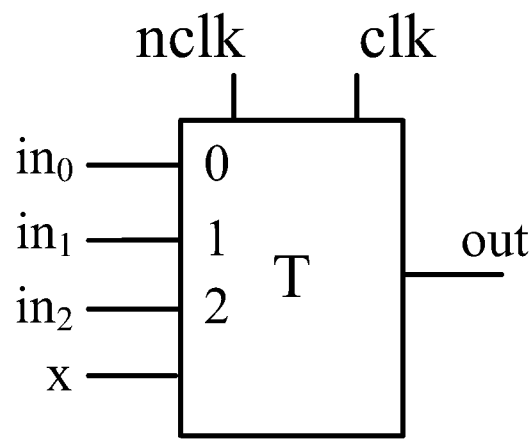
FIG. 10 is a graphical diagram of a ternary adiabatic Domino T-operation circuit according to one embodiment of the invention.

FIG. 6 is a graphical diagram of the ternary adiabatic Domino positive and negative circulation port. The ternary adiabatic Domino T-operation circuit comprises a Logic 0 gating circuit, a Logic 1 gating circuit, and a Logic 2 gating circuit. As shown in FIGS. 7, 8, and 9, the Logic 0 gating circuit comprises a nineteenth PMOS P19, a twentieth PMOS P20, a twenty-first PMOS P21, a thirty-eighth NMOS N38, a thirty-ninth NMOS N39, a fortieth NMOS N40, a forty-first NMOS N41 and a forty-second NMOS N42; the Logic 2 gating circuit comprises a twenty-second PMOS P22, a twenty-third PMOS P23, a forty-third NMOS N43, a forty-fourth NMOS N44 and a forty-fifth NMOS N45; the Logic 1 gating circuit comprises a twenty-fourth PMOS P24, a twenty-fifth PMOS P25, a forty-sixth NMOS N46, a forty-seventh NMOS N47, a forty-eighth NMOS N48 and a forty-ninth NMOS N49; the source of the nineteenth PMOS P19, the source of the twentieth PMOS P20, the drain of the thirty-ninth NMOS N39, the drain of the forty-first NMOS N41, the gate of the forty-second NMOS N42, the source of the twenty-second PMOS P22, the drain of the forty-fourth NMOS N44, the gate of the forty-fifth NMOS N45, the source of the twenty-fourth PMOS P24, the drain of the forty-eighth NMOS N48 and the gate of the forty-ninth NMOS N49 are connected and a connection terminal thereof serves as the first clock signal input end of the ternary adiabatic Domino T-operation circuit; the gate of the nineteenth PMOS P19, the gate of the twentieth PMOS P20, the gate of the thirty-ninth NMOS N39, the gate of the forty-first NMOS N41, the gate of the twenty-second PMOS P22, the gate of the forty-fourth NMOS N44, the gate of the twenty-fourth PMOS P24 and the gate of the forty-eighth NMOS N48 are connected and a connection terminal thereof serves as the second clock signal input end of the ternary adiabatic Domino T-operation circuit; the drain of the nineteenth PMOS P19, the source of the thirty-eighth NMOS N38 and the gate of the fortieth NMOS N40 are connected; the drain of the thirty-eighth NMOS N38 and the source of the thirty-ninth NMOS N39 are connected; the drain of the twentieth PMOS P20, the source of the fortieth NMOS N40, the gate of the twenty-first PMOS P21 and the gate of the forty-sixth NMOD N46 are connected; the drain of the fortieth NMOS N40 and the source of the forty-first NMOS N41 are connected; the source of the twenty-first PMOS P21 and the drain of the forty-second NMOS N42 are connected and a connection terminal thereof serves as the first signal input end of the ternary adiabatic Domino T-operation circuit; the gate of the thirty-eighth NMOS N38 and the gate of the forty-third NMOS N43 are connected and a connection terminal thereof serves as the selection signal input end of the ternary adiabatic Domino T-operation circuit; the drain of the twenty-second PMOS P22, the source of the forty-third NMOS N43, the gate of the twenty-third PMOS P23 and the gate of the forty-seventh NMOS N47 are connected; the drain of the forty-third NMOS N43 and the source of the forty-fourth NMOS N44 are connected; the source of the twenty-third PMOS P23 and the drain of the forty-fifth NMOS N45 are connected and a connection terminal thereof serves as the third signal input end of the ternary adiabatic Domino T-operation circuit; the drain of the twenty-fourth PMOS P24, the source of the forty-sixth NMOS N46 and the gate of the twenty-fifth PMOS P25 are connected; the drain of the forty-sixth NMOS N46 and the source of the forty-seventh NMOS N47 are connected; the drain of the forty-seventh NMOS N47 and the source of the forty-eighth NMOS N48 are connected; the source of the twenty-fifth PMOS P25 and the drain of the forty-ninth NMOS N49 are connected and a connection terminal thereof serves as the second signal input end of the ternary adiabatic Domino T-operation circuit; the drain of the twenty-first PMOS P21, the source of the forty-second NMOS N42, the drain of the twenty-third PMOS P23, the source of the forty-fifth NMOS N45, the drain of the twenty-fifth PMOS P25 and the source of the forty-ninth NMOS N49 are connected and a connection terminal thereof serves as the signal output end of the ternary adiabatic Domino T-operation circuit. FIG. 10 is a graphical diagram of a ternary adiabatic Domino T-operation circuit.

The circuit for a low-power ternary Domino reversible counting unit of the invention features low power and accurate logic, so it can be used for establishing a ternary adiabatic Domino reversible counter.

While particular embodiments of the invention have been shown and described, it will be obvious to those skilled in the art that changes and modifications may be made without departing from the invention in its broader aspects, and therefore, the aim in the appended claims is to cover all such changes and modifications as fall within the true spirit and scope of the invention.

The invention claimed is:

1. A circuit for a ternary Domino reversible counting unit, the circuit comprising a ternary adiabatic Domino D flip-flop, a ternary adiabatic Domino positive and negative circulation port, and a ternary adiabatic Domino T-operation circuit; wherein the ternary adiabatic Domino D flip-flop comprises a signal input end, a reset terminal, a set terminal, a reverse-phase set terminal, a signal output end, a first clock signal input end, a second clock signal input end, and a third clock signal input end; the first clock signal input end of the ternary adiabatic Domino D flip-flop receives a first clock signal, the second clock signal input end of the ternary adiabatic Domino D flip-flop receives a second clock signal, and the third clock signal input end of the ternary adiabatic Domino D flip-flop receives a third clock signal; amplitude levels of the first clock signal and the second clock signal correspond to Logic 2, and a phase difference of the first clock signal and the second clock signal is 180 degrees; an amplitude level of the third clock signal correspond to Logic 1, and a phase of the third clock signal is the same as that of the second clock signal;

the ternary adiabatic Domino positive and negative circulation port comprises a signal input end, a borrow terminal, a carry terminal, a first output end, a second output end, a first clock signal input end, a second clock signal input end, and a third clock signal input end; the first clock signal input end of the ternary adiabatic Domino positive and negative circulation port receives the first clock signal; the second clock signal input end of the ternary adiabatic Domino positive and negative circulation port receives the second clock signal; and the third clock signal input end of the ternary adiabatic Domino positive and negative circulation port receives the third clock signal;

the ternary adiabatic Domino T-operation circuit comprises a first signal input end, a second signal input end, and a third signal input end, a selection signal input end, a signal output end, a first clock signal input end, and a second clock signal input end; the first clock signal input end of the ternary adiabatic Domino T-operation circuit receives the first clock signal; the second clock signal input end of the ternary adiabatic Domino T-operation circuit receives the second clock signal;

the borrow terminal of the ternary adiabatic Domino positive and negative circulation port is a borrow terminal of the ternary Domino reversible counting unit; the carry terminal of the ternary adiabatic Domino positive and negative circulation port is a carry terminal of the ternary Domino reversible counting unit; the first output end of the ternary adiabatic Domino positive and negative circulation port is connected to the first signal input end of the ternary adiabatic Domino T-operation circuit; the second output end of the ternary adiabatic Domino positive and negative circulation port is connected to the third signal input end of the ternary adiabatic Domino T-operation circuit; the signal output end of the ternary adiabatic Domino T-operation is connected to the signal input end of the ternary adiabatic Domino D flip-flop; the signal input end of the ternary adiabatic Domino positive and negative circulation port is connected to the signal output end of the ternary adiabatic Domino D flip-flop, and a common connection end thereof is a signal output end of the ternary Domino reversible counting unit; the selection signal input end of the ternary adiabatic Domino T-operation circuit is a selection signal input end of the ternary Domino reversible counting unit; the reset terminal of the ternary adiabatic Domino D flip-flop is a reset terminal of the ternary Domino reversible counting unit; the set terminal of the ternary adiabatic Domino D flip-flop is a set terminal of the ternary Domino reversible counting unit; and the reverse-phase set terminal of the ternary adiabatic Domino D flip-flop is a reverse-phase set terminal of the ternary Domino reversible counting unit.

2. The circuit of claim 1, wherein the ternary adiabatic Domino D flip-flop comprises a first ternary adiabatic Domino literal operation circuit, a Logic 1 and Logic 2 control signal generation circuit, and a response signal output circuit;

the first ternary adiabatic Domino literal operation circuit comprises a first PMOS, a second PMOS, a third PMOS, a fourth PMOS, a fifth PMOS, a sixth PMOS, a first NMOS, a second NMOS, a third NMOS, a fourth NMOS, a fifth NMOS, a sixth NMOS, a seventh NMOS, an eighth NMOS, a ninth NMOS, a tenth NMOS, an eleventh NMOS, a twelfth NMOS, and a thirteenth NMOS; each PMOS and each NMOS comprises a gate, a source, and a drain; the source of the first PMOS, the drain of the second NMOS, the gate of the second PMOS, the gate of the third NMOS, the source of the fourth PMOS, the drain of the fifth NMOS, the gate of the fifth PMOS, the gate of sixth NMOS, the source of the ninth NMOS, the source of the eleventh NMOS, and the source of the thirteenth NMOS are connected, and a common connecting terminal thereof serves as a first clock signal input end of the first ternary adiabatic Domino literal operation circuit; the gate of the first PMOS, the gate of the second NMOS, the source of the second PMOS, the drain of the third NMOS, the gate of the fourth PMOS, the gate of the fifth NMOS, the source of the fifth PMOS, the drain of the sixth NMOS, the gate of the eighth NMOS, the gate of the tenth NMOS and the gate of the twelfth NMOS are connected, and a common connecting terminal thereof serves as a second clock signal input end of the first ternary adiabatic Domino literal operation circuit; the gate of the first NMOS and the gate of the fourth NMOS are connected, and a common connecting terminal thereof serves as a signal input end of the first ternary adiabatic Domino literal operation circuit; the drain of the first PMOS, the source of the first NMOS, the gate of the third PMOS and the source of the tenth NMOS are connected; the drain of the first NMOS and the source of the second NMOS are connected; the drain of the second PMOS and the source of the third PMOS are connected, the drain of the third PMOS, the source of the third NMOS and the source of the seventh NMOS are connected; the drain of the fourth PMOS, the source of the fourth NOMS, the gate of the sixth PMOS and the gate of the seventh NMOS are connected; the drain of the fourth NOMS and the source of the fifth NMOS are connected; the drain of the fifth PMOS and the source of the sixth PMOS are connected; the drain of the sixth PMOS, the source of the sixth NMOS and the source of the eighth NMOS are connected; the drain of the eighth NOMS and the gate of the ninth NMOS are connected; the drain of the tenth NMOS and the gate of the eleventh NMOS are connected; the drain of the seventh NMOS and the source of the twelfth NMOS are connected; the drain of the twelfth NMOS and the gate of the thirteenth NMOS are connected; the drain of the ninth NMOS is a third signal output end of the first ternary adiabatic Domino literal operation circuit; the drain of the eleventh NMOS is a first signal output end of the first ternary adiabatic Domino literal operation circuit; the drain of the thirteenth NMOS is a second signal output end of the first ternary adiabatic Domino literal operation circuit;

the Logic 1 and Logic 2 control signal generation circuit comprises a seventh PMOS, an eighth PMOS, a fourteenth NMOS, a fifteenth NMOS, a sixteenth NMOS, a seventeenth NMOS, an eighteenth NMOS, a nineteenth NMOS, and a twentieth NMOS; the response signal output circuit comprises a ninth PMOS, a tenth PMOS, and a twenty-first NMOS; the source of the seventh PMOS, the source of the eighth PMOS, the drain of the twentieth NMOS, the gate of the twenty-first NMOS are connected to the first clock signal input end of the first ternary adiabatic Domino literal operation circuit and a connection terminal thereof serves as the first clock signal input end of the ternary adiabatic Domino D flip-flop; the gate of the seventh PMOS, the gate of the eighth PMOS, the gate of the twentieth NMOS, the source of the tenth PMOS, and the drain of the twenty-first NMOS are connected to the second clock signal input end of the first ternary adiabatic Domino literal operation circuit and a connection terminal thereof serves as the second clock signal input end of the ternary adiabatic Domino D flip-flop; the source of the ninth PMOS serves as the third clock signal input end of the ternary adiabatic Domino D flip-flop; the drain of the seventh PMOS, the source of the fourteenth NOMS and the gate of the ninth PMOS are connected; the drain of the eighth PMOS, the source of the fifteenth NMOS, the source of the sixteenth NMOS and the gate of the tenth PMOS are connected; the drain of the fourteenth NMOS, the drain of the fifteenth NMOS and the source of the seventeenth NMOS are connected; the drain of the seventeenth NMOS and the source of the eighteenth NMOS are connected; the drain of the eighteenth NMOS, the source of the twentieth NMOS and the drain of the nineteenth NMOS are connected; the source of the nineteenth NMOS and the drain of the sixteenth NMOS are connected; the gate of the fourteenth NMOS and the second signal output end of the first ternary adiabatic Domino T-operation circuit are connected; the gate of the fifteenth NMOS and the third signal output end of the first ternary adiabatic Domino T-operation circuit are connected; the gate of the sixteenth NMOS and the gate of the seventeenth NMOS are connected and a connection terminal thereof serves as the reset terminal of the ternary adiabatic Domino D flip-flop; the gate of the eighteenth NMOS is the reset terminal of the ternary adiabatic Domino D flip-flop; the gate of the nineteenth NMOS is the reverse-phase set terminal of the ternary adiabatic Domino D flip-flop; the drain of the ninth PMOS, the drain of the tenth PMOS and the source of the twenty-first NMOS are connected and a connection terminal thereof serves as the signal output end of the ternary adiabatic Domino D flip-flop.

3. The circuit of claim 2, wherein the ternary adiabatic Domino positive and negative circulation port comprises a second ternary adiabatic Domino literal operation circuit, a third ternary adiabatic Domino literal operation circuit, a fourth ternary adiabatic Domino literal operation circuit, a Logic 1 and Logic 2 control signal generation circuit of a positive circulation port, a Logic 1 and Logic 2 control signal generation circuit of a negative circulation port, a first output circuit, and a second output circuit. Circuit structures of the second ternary adiabatic Domino literal operation circuit, the third ternary adiabatic Domino literal operation circuit, the fourth ternary adiabatic Domino literal operation circuit are the same as that of the first ternary adiabatic Domino literal operation circuit;

the Logic 1 and Logic 2 control signal generation circuit of the positive circulation port comprises an eleventh PMOS, a twelfth PMOS, a thirteenth PMOS, a fourteenth PMOS, a twenty-second NMOS, a twenty-third NMOS, a twenty-fourth NMOS, a twenty-fifth NMOS, a twenty-sixth NMOS, a twenty-seventh NMOS, a twenty-eighth NMOS, a twenty-ninth NMOS, a thirtieth NMOS, a thirty-first NMOS, a thirty-second NMOS, a thirty-third NMOS, a thirty-fourth NMOS and a thirty-fifth NMOS; the first output circuit comprises a fifteenth PMOS, a sixteenth PMOS and a thirty-six NMOS; the second output circuit comprises a seventeenth PMOS, an eighteenth PMOS and a thirty-seventh NMOS; the source of the eleventh PMOS, the source of the twelfth PMOS, the drain of the twenty-fourth NOMS, the source of the thirteenth PMOS, the source of the fourteenth PMOS, the drain of the thirty-first NMOS, the gate of the thirty-sixth NMOS, the gate of the thirty-seventh NMOS, the first clock signal input end of the second ternary adiabatic Domino literal operation circuit, the first clock signal input end of the third ternary adiabatic Domino literal operation circuit, and the first clock signal input end of the fourth ternary adiabatic Domino literal operation circuit are connected and a connection terminal thereof serves as the first clock signal input end of the ternary adiabatic Domino positive and negative circulation port; the gate of the eleventh PMOS, the gate of the twelfth PMOS, the gate of the twenty-fourth NMOS, the gate of the thirteenth PMOS, the gate of the fourteenth PMOS, the gate of the thirty-first NMOS, the source of the sixteenth PMOS, the drain of the thirty-sixth NMOS, the source of the eighteenth PMOS, the drain of the thirty-seventh NMOS, the second clock signal input end of the second ternary adiabatic Domino literal operation circuit, the second clock signal input end of the third ternary adiabatic Domino literal operation circuit, and the second clock signal input end of the fourth ternary adiabatic Domino literal operation circuit are connected and a connection terminal thereof serves as the second clock signal input end of the ternary adiabatic Domino positive and negative circulation port, the source of the fifteenth PMOS and the source of the seventeenth PMOS are connected and a connection terminal thereof serves as the third clock signal input end of the ternary adiabatic Domino positive and negative circulation port; the drain of the eleventh PMOS, the source of the twenty-second NMOS, the source of the twenty-sixth NMOS and the gate of the fifteenth PMOS are connected; the drain of the twelfth PMOS, the source of the twenty-seventh NMOS, the source of the twenty-eighth NMOS and the gate of the sixteenth PMOS are connected; the drain of the twenty-second NMOS, the source of the twenty-third NMOS and the drain of the twenty-seventh NMOS are connected; the drain of the twenty-sixth NMOS, the source of the twenty-fifth NMOS and the drain of the twenty-eighth NMOS are connected; the drain of the twenty-third NMOS, the drain of the twenty-fifth NMOS and the source of the twenty-fourth NMOS are connected; the drain of the thirteen PMOS, the source of the twenty-ninth NMOS, the source of the thirty-third NMOS and the gate of the seventeenth PMOS are connected; the drain of the fourteenth PMOS, the source of the thirty-fourth NMOS, the source of the thirty-fifth NMOS and the gate of the eighteenth PMOS are connected; the drain of the twenty-ninth NMOS, the source of the thirtieth NMOS and the drain of the thirty-fourth NMOS are connected; the drain of the thirty-third NMOS, the source of the thirty-second NMOS and the drain of the thirty-fifth NMOS are connected; the drain of the thirtieth NMOS, the drain of the thirty-second NMOS and the source of the thirty-first NMOS are connected; the drain of the fifteenth PMOS, the drain of the sixteenth PMOS and the source of the thirty-sixth NMOS are connected and a connection terminal thereof serves as the first signal output end of the ternary adiabatic Domino positive and negative circulation port; the drain of the seventeenth PMOS, the drain of the eighteenth PMOS and the source of the thirty-seventh NMOS are connected and a connection terminal thereof serves as the second signal output end of the ternary adiabatic Domino positive and negative circulation port; the gate of the twenty-second NMOS, the gate of thirty-fourth NMOS and the first signal output end of the second ternary adiabatic Domino literal operation circuit are connected; the gate of the twenty-sixth NMOS, the gate of the twenty-seventh NMOS, the gate of the thirty-third NMOS and the second signal output end of the second ternary adiabatic Domino literal operation circuit are connected; the gate of the twenty-eighth NMOS, the gate of the twenty-ninth NMOS, the gate of the thirty-fifth NMOS and the third signal output end of the second ternary adiabatic Domino literal operation circuit are connected; the gate of the twenty-fifth NMOS and the first signal output end of the third ternary adiabatic Domino literal operation circuit are connected; the gate of the twenty-third NMOS and the third signal output end of the third ternary adiabatic Domino literal operation circuit; the gate of the thirtieth NMOS and the first signal output end of the fourth ternary adiabatic Domino literal operation circuit are connected; the gate of the thirty-second NMOS and the third signal output end of the fourth ternary adiabatic Domino literal operation circuit are connected; the signal input end of the second ternary adiabatic Domino literal operation circuit serves as the signal input end of the ternary adiabatic Domino positive and negative circulation port; the signal input end of the fourth ternary adiabatic Domino literal operation circuit serves as the carry terminal of the ternary adiabatic Domino positive and negative circulation port, the signal input end of the fourth ternary adiabatic Domino literal operation circuit serves as the borrow terminal of the ternary adiabatic Domino positive and negative circulation port.

4. The circuit of claim 1, wherein the ternary adiabatic Domino T-operation circuit comprises a Logic 0 gating circuit, a Logic 1 gating circuit, and a Logic 2 gating circuit;

the Logic 0 gating circuit comprises a nineteenth PMOS, a twentieth PMOS, a twenty-first PMOS, a thirty-eighth NMOS, a thirty-ninth NMOS, a fortieth NMOS, a forty-first NMOS and a forty-second NMOS;

the Logic 2 gating circuit comprises a twenty-second PMOS, a twenty-third PMOS, a forty-third NMOS, a forty-fourth NMOS and a forty-fifth NMOS;

the Logic 1 gating circuit comprises a twenty-fourth PMOS, a twenty-fifth PMOS, a forty-sixth NMOS, a forty-seventh NMOS, a forty-eighth NMOS and a forty-ninth NMOS;

the source of the nineteenth PMOS, the source of the twentieth PMOS, the drain of the thirty-ninth NMOS, the drain of the forty-first NMOS, the gate of the forty-second NMOS, the source of the twenty-second PMOS, the drain of the forty-fourth NMOS, the gate of the forty-fifth NMOS, the source of the twenty-fourth PMOS, the drain of the forty-eighth NMOS and the gate of the forty-ninth NMOS are connected and a connection terminal thereof serves as the first clock signal input end of the ternary adiabatic Domino T-operation circuit; the gate of the nineteenth PMOS, the gate of the twentieth PMOS, the gate of the thirty-ninth NMOS, the gate of the forty-first NMOS, the gate of the twenty-second PMOS, the gate of the forty-fourth NMOS, the gate of the twenty-fourth PMOS and the gate of the forty-eighth NMOS are connected and a connection terminal thereof serves as the second clock signal input end of the ternary adiabatic Domino T-operation circuit; the drain of the nineteenth PMOS, the source of the thirty-eighth NMOS and the gate of the fortieth NMOS are connected; the drain of the thirty-eighth NMOS and the source of the thirty-ninth NMOS are connected; the drain of the twentieth PMOS, the source of the fortieth NMOS, the gate of the twenty-first PMOS and the gate of the forty-sixth NMOD are connected; the drain of the fortieth NMOS and the source of the forty-first NMOS are connected; the source of the twenty-first PMOS and the drain of the forty-second NMOS are connected and a connection terminal thereof serves as the first signal input end of the ternary adiabatic Domino T-operation circuit; the gate of the thirty-eighth NMOS and the gate of the forty-third NMOS are connected and a connection terminal thereof serves as the selection signal input end of the ternary adiabatic Domino T-operation circuit; the drain of the twenty-second PMOS, the source of the forty-third NMOS, the gate of the twenty-third PMOS and the gate of the forty-seventh NMOS are connected; the drain of the forty-third NMOS and the source of the forty-fourth NMOS are connected; the source of the twenty-third PMOS and the drain of the forty-fifth NMOS are connected and a connection terminal thereof serves as the third signal input end of the ternary adiabatic Domino T-operation circuit; the drain of the twenty-fourth PMOS, the source of the forty-sixth NMOS and the gate of the twenty-fifth PMOS are connected; the drain of the forty-sixth NMOS and the source of the forty-seventh NMOS are connected; the drain of the forty-seventh NMOS and the source of the forty-eighth NMOS are connected; the source of the twenty-fifth PMOS and the drain of the forty-ninth NMOS are connected and a connection terminal thereof serves as the second signal input end of the ternary adiabatic Domino T-operation circuit; the drain of the twenty-first PMOS, the source of the forty-second NMOS, the drain of the twenty-third PMOS, the source of the forty-fifth NMOS, the drain of the twenty-fifth PMOS and the source of the forty-ninth NMOS are connected and a connection terminal thereof serves as the signal output end of the ternary adiabatic Domino T-operation circuit.

\* \* \* \* \*